(12) United States Patent
Chen et al.

(10) Patent No.: US 7,479,438 B2
(45) Date of Patent: Jan. 20, 2009

(54) METHOD TO IMPROVE PERFORMANCE OF A BIPOLAR DEVICE USING AN AMORPHIZING IMPLANT

(75) Inventors: Alan S. Chen, Windermere, FL (US); Mark Dyson, Singapore (SG); Daniel C. Kerr, Oak Ridge, NC (US); Nace M. Rossi, Singapore (SG)

(73) Assignee: Agere Systems Inc., Allentown, PA (US)

( * ) Notice: Subject to any disclaimer, the term of this patent is extended or adjusted under 35 U.S.C. 154(b) by 357 days.

(21) Appl. No.: 11/469,032

(22) Filed: Aug. 31, 2006

(65) Prior Publication Data

US 2008/0054406 A1  Mar. 6, 2008

(51) Int. Cl.
*H01L 21/331* (2006.01)
*H01L 27/092* (2006.01)

(52) U.S. Cl. ...................... 438/365; 257/592

(58) Field of Classification Search ................ 438/338, 438/342, 365–368; 257/197, 517, 565, 592
See application file for complete search history.

(56) References Cited

U.S. PATENT DOCUMENTS

| | | | | |
|---|---|---|---|---|
| 5,234,845 | A * | 8/1993 | Aoki et al. | 438/316 |
| 6,180,478 | B1 * | 1/2001 | Lee et al. | 438/309 |
| 6,362,066 | B1 * | 3/2002 | Ryum et al. | 438/364 |
| 2006/0267007 | A1 * | 11/2006 | Salzman et al. | 257/46 |

* cited by examiner

*Primary Examiner*—Calvin Lee

(57) ABSTRACT

The invention, in one aspect, provides a semiconductor device that comprises a bipolar transistor located over and within a semiconductor substrate, a collector located within a tub of the bipolar transistor and having an amorphous region formed at least partially therein, a base located over the collector, and an emitter located over the base. There is also provided a method of fabricating the semiconductor device.

23 Claims, 5 Drawing Sheets

METHOD TO IMPROVE PERFORMANCE OF A BIPOLAR DEVICE USING AN AMORPHIZING IMPLANT

TECHNICAL FIELD OF THE INVENTION

The invention is directed, in general, to a method of manufacturing a semiconductor device and, more specifically, to a method that improves the performance of a bipolar device using an amorphizing implant.

BACKGROUND OF THE INVENTION

Optimization of semiconductor devices continues to be an important goal for the semiconductor industry. The continued miniaturization of semiconductor devices, such as bipolar transistors, presents ongoing challenges to semiconductor manufacturers in maintaining or improving overall device performance. One such example resides in the problems associated with defects, such as collector-emitter (CE) pipes, which is a short-circuit between the collector and emitter. Defects can occur in the collector of a bipolar transistor as the result of a boron implantation step. In many designs, boron is used as the dopant to impart the required degree of conductivity to the collector. This is achieved through the implantation of boron that is typically conducted at a medium energy and at medium to high doses. This type of implant can, unfortunately, lead to a high density defects or threading dislocations that give rise to CE pipes. The boron collector implant creates a region of defects near the range of the implant. The implantation is typically followed by an anneal, and the implanted boron is subjected to thermal budgets associated with subsequent processing steps. During these thermal processes, boron can readily diffuse along the length of the dislocations and diffuse into the silicon adjacent to the dislocations. The dislocations act like pipes or soaker hoses that carry boron along the dislocations and into the silicon adjacent to it. The boron atoms can easily diffuse to such an extent and create a conductive path between the emitter and the collector. If the dislocations extend between the collector and emitter, in particular, through the n-type base region, the pipes will create thin p-type regions through the n-type base, which shorts between the collector and emitter and leads to a defective device. In turn, reliability and yields are significantly reduced.

To address this issue, the semiconductor manufacturing industry has attempted to reduce the number of defects by reducing the boron dose. Unfortunately, this can affect device performance in that the collector substrate becomes less conductive and more resistive, which can reduce device speed and overall performance. Alternatively, the semiconductor manufacturing industry has also attempted to implant a shallow, high density layer, and then epitaxially grow silicon on it. This approach is inherently expensive because it requires an additional mask for the buried layer implant and additional epi step.

Accordingly, there is a need to provide a process and device by which dislocations or defects in bipolar devices can be reduced without sacrificing device performance and significantly increasing production costs.

SUMMARY OF THE INVENTION

To address the above-discussed deficiencies, the invention provides, in one embodiment, a method of manufacturing a semiconductor device. In this embodiment, the method comprises forming an amorphous region at least partially in a collector region for a bipolar transistor, forming a collector in the collector region, forming a base over the collector region, and forming an emitter over the base.

In another embodiment, the invention provides another semiconductor device. In this embodiment, the semiconductor device comprises a bipolar transistor located over and within a semiconductor substrate, a collector located within the semiconductor substrate and having an amorphous region formed at least partially therein, a base located over the collector, and an emitter located over the base.

In another embodiment, the invention provides a method of manufacturing an integrated circuit. This embodiment comprises forming non-bipolar transistors over a semiconductor substrate and forming bipolar transistors over the semiconductor substrate. The bipolar transistors are formed by forming an amorphous region at least partially in a collector region of at least one of the bipolar transistors, forming a collector in the collector region, forming a base over the collector region, and forming an emitter over the base. This embodiment further includes forming dielectric layers over the non-bipolar transistors and bipolar transistors and forming interconnects in the dielectric layers that electrically connect the non-bipolar and bipolar transistors.

The foregoing has outlined one embodiment the invention so that those skilled in the art may better understand the detailed description of the invention that follows. Additional embodiments and features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
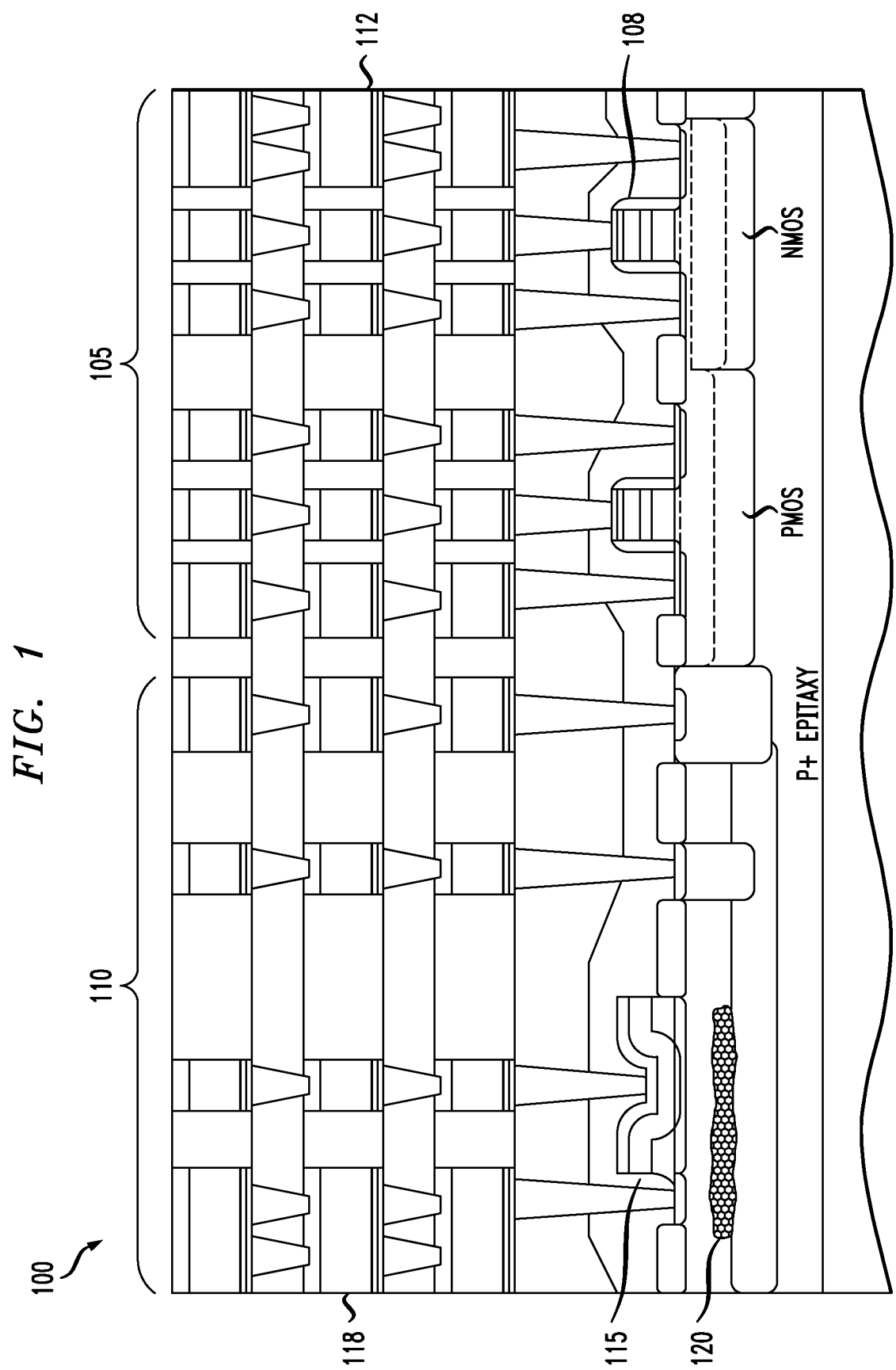
FIG. 1 illustrates a semiconductor device as provided by one embodiment of the invention.

Referring initially to FIG. 1, there is illustrated a general, partial view of a semiconductor device 100 as provided by the invention. In this embodiment, the semiconductor device 100 includes a transistor region 105 comprising non-bipolar transistors 108 (i.e., gates electrodes or other active devices or other active devices that are not configured as bipolar devices), such as PMOS or NMOS transistors, and interconnects 112 that may be of conventional design and manufactured with conventional processes and materials. In the illustrated embodiment, the PMOS and NMOS transistors are configured as a complementary CMOS device, but other configurations known to those skilled in the art are also within the scope of the invention. The semiconductor device 100 further includes a bipolar transistor region 110. The region 110 includes bipolar transistors 115, such as a vertical PNP bipolar transistor, and interconnects 118 that may be fabricated using conventional processes and materials. It should be noted that while separately designated for purposes of pointing to different areas of the device 100, interconnects 112 and 118 can be fabricated simultaneously and with the same deposition processes and materials. In addition, however, and unlike conventional devices, the bipolar transistor 115 further comprises an amorphous region 120. The amorphous region 120 is that portion of the semiconductor substrate where the substrate is amorphous. As discussed below, the amorphous region 120 may be created in a number of ways. For example, the amorphization may be accomplished by conducting a pre-amorphizing step prior to conducting a collector implant step. In another embodiment, the amorphization may be accomplished by implanting a dopant or dopants that have larger atomic weights than boron, or by implanting boron at much higher energies than what is conventionally done. Thus, in these embodiments, the amorphous region and the implantation of the collector may occur concurrently.

The invention recognizes that by forming an amorphous region at least partially within the collector of a bipolar transistor, defects between the base and collector can be reduced when compared with conventional processes. Moreover, because the methods discussed herein are relatively simple from a processing standpoint, the stated advantages can be achieved without significant additional processing steps or cost.

Figure 2:
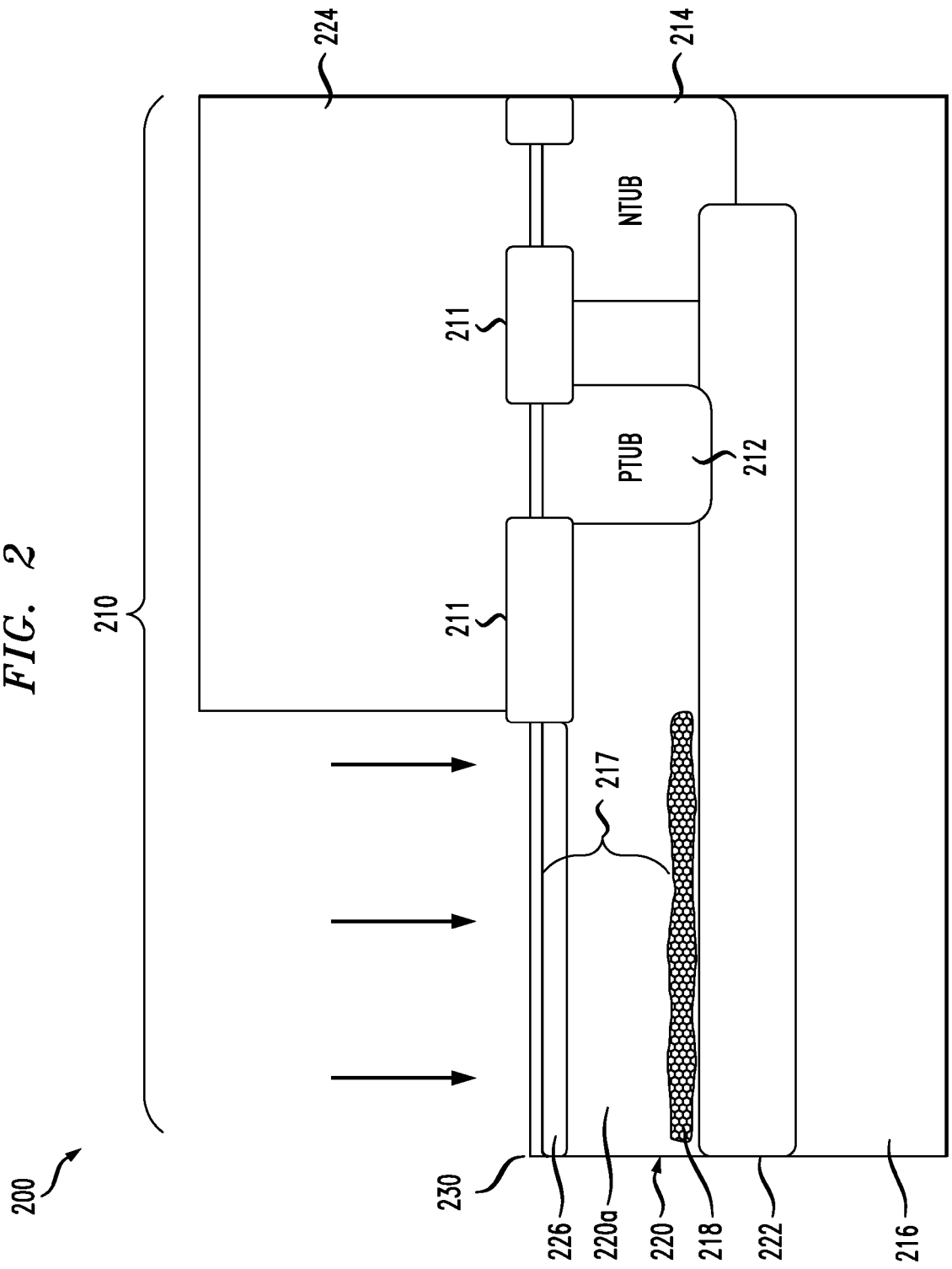
FIG. 2 illustrates a view of one embodiment of a semiconductor device during the formation of an amorphous region within a collector region.

FIG. 2 illustrates a partial view of one embodiment of a semiconductor device 200 provided by the present invention and at an early stage of manufacture. In this view, there is illustrated a bipolar transistor region 210, the previously mentioned non-bipolar transistor region, which may also be present, is not shown here for brevity. However, several steps, which may be conventional, in constructing the non-bipolar transistor may have occurred at this point. For instance, isolation structures 211, as those shown in the bipolar region, may have been formed at this point along with NMOS and PMOS tub implants. During the formation of the NMOS and PMOS tub implants, P tubs and N tubs 212, 214 may also be formed in the bipolar region 210. The region 210, as well as the non-bipolar region when present, is formed over and within a semiconductor substrate 216, such as a conventional epitaxial layer or a doped layer of a semiconductor wafer. The wafer or epitaxial layer may be any number of semiconductor substrate types, such as doped silicon, silicon germanium, gallium arsenide, or indium.

At this stage of fabrication, any gate electrodes and corresponding lightly doped source/drains in the non-bipolar region may also have already been formed. FIG. 2 further illustrates the formation of an amorphous region 218 in a collector region 220. An amorphous region 218 is that portion of the substrate that is a non-crystalline solid that has either little to no periodicity or long-range order or whose crystalline structure has been physically altered or disrupted. For example, during the amorphization step, the crystalline structure of the substrate is damaged by the amorphization process. It has been observed that the amorphous nature of the substrate inhibits or reduces the dopant diffusion along threading dislocations from the collector to the base, thereby inhibiting or preventing shorts between the base and the collector. A collector region is any portion of the substrate in which a collector is or is intended to be formed and after the collector is formed, the collector region is synonymous with the collector. In some embodiments, an isolation region 222, such as an n-doped isolation NISO region, may be located under the collector region 220. A mask 224 protects other non-targeted regions from the effects of the amorphization process. The amorphous region 218 is located at least partially within collector 220a. In such embodiments, a portion of the amorphous region 218 may also be located within the isolation region 222. In alternative embodiments, the amorphous region 218 is located entirely within the collector 220a.

The amorphous region 218 may be formed in a number of ways. For example, in one embodiment, the amorphous region 218 is formed by conducting a pre-amorphization implant before collector 220a is formed in the collector region 220. The dopant used to create the amorphous region 218 may also vary. However, in one embodiment, the doping species has an atomic weight that is greater than boron. Examples of a few of these doping species include silicon or argon. The doping species of greater atomic weight are particularly useful in the invention. Because of their heavier weights, the doping species can cause greater amorphization to take place at lower implant energies.

The implant parameters will vary, depending on the doping species being used. For example, if the doping species is silicon, the implant power may range from about 400 keV to about 1000 keV, and the dosage may range from about 5 E13 atoms/cm$^2$ to about 5 E15 atoms/cm$^2$. By way of another example, if the doping species is argon, the implant power may range from about 700 keV to about 1300 keV, and the dosage may range from about 9 E13 atoms/cm$^2$ to about 9 E14 atoms/cm$^2$. These illustrative parameters have shown to provide an amorphous region that is optimally located within the collector region 220 or collector 220a, depending on when the amorphous region is formed. However, it should be understood that implant parameters may vary depending on the implantation tool and that other implant parameters that provide the stated benefits of the invention may also be used.

The ranges given for silicon and argon are provided as examples only. Other implant species such as germanium and neon can be used as well. They create high dislocation density at certain implants doses, but at higher dosages the density of dislocation decreases rapidly to a low level. The heavy ion implant from these species creates a region with significant amorphous character, and subsequently, the boron is implanted into that region. It should be understood that implanting with these heavy ions does not necessarily have to occur before the collector boron implant. The boron can be implanted to form the collector before the pre-amorphization.

The depth as measured from the top surface of the semiconductor substrate 216 and thickness of the amorphous region 218 will also depend on the doping species and implant energies used and will scale with the overall size of the device. The depth may be determined from the approximate top or bottom of the amorphous region 218. For example, the distance 217 may be measured from the approximate top of the amorphous region 218 to the top of the semiconductor substrate 216, and in one embodiment, may range from about 0.02 microns to about 1.5 microns. Alternatively, the depth may be measured from approximate bottom of the amorphous region 218 to the top of the semiconductor substrate and may range from about 0.05 microns to about 1.8 microns. These values are approximated to account for the graded edges (i.e., where the substrates gradually transitions from an amorphous character to a crystalline character) of the amorphous region 218. The average thickness of the amorphous region 218 may range from about 0.03 microns to about 1 micron. These values are given as illustrative examples only, and other values for the depth and thickness of amorphization are also within the scope of the present invention and may depend on the device performance requirements, design, or overall size.

It should be noted that if the depth of the amorphous region 218 is too deep, collector-silicon (C-S) leakage may result. Thus, it is desirable to adequately control the depth of the amorphous region 218 to minimize C-S leakage. Further, it is possible that some re-crystallization will occur during subsequent processing steps that include temperatures high enough to repair or re-crystallize the silicon. In such instances, the thickness of the amorphous region 218 should be sufficient such that enough of the amorphous region 218 remains to reduce the diffusion of the collector implanted dopants. This can easily be determined by those skilled in the art.

In another embodiment, the collector implant step and the amorphizing step occur concurrently. In such embodiments, examples of the doping species may be boron, aluminum, gallium or indium. Here, the doping species not only amorphizes the semiconductor substrate, but it also functions as the dopant for the collector. Thus, the doping species should be sufficiently conductive to impart the requisite conductivity to the collector. In the case of aluminum, the range for the implant energy may range from about 500 keV to about 1200 keV, and the dosage may range from about 1 E14 atoms/cm$^2$ to about 6 E14 atoms/cm$^2$. In the case of gallium, the range for the implant energy may range from about 800 keV to about 2000 keV, and the dosage may range from about 8 E13 atoms/cm$^2$ to about 6 E14 atoms/cm$^2$. In the case of indium, the range for the implant energy may range from about 1200 keV to about 3000 keV, and the dosage may range from about 6 E13 atoms/cm$^2$ to about 6 E14 atoms/cm$^2$. The dosage and power should be conducted at parameters that are sufficient to amorphize the semiconductor substrate. Particularly, the power may be increased to a level sufficient to bring about the desired degree of amorphization without significantly changing the dopant concentrations from those associated with conventional collector implants. Again, these illustrative parameters have shown to provide a good amorphous region that is optimally located, but it should be understood that implant parameters may vary depending on the implantation tool and that other implant parameters that provide the stated benefits of the invention may also be used.

In the case of boron, to achieve desired results, the implant conditions may be conducted at lower substrate temperatures ranging from about 25° C. to about 50° C. and at high beam currents ranging from about 1 mA to about 3 mA. A typical dose for boron may range from about 8 E13 atoms/cm$^2$ to about 6 E14 atoms/cm$^2$ and at a power ranging from about 200 keV to about 500 keV. The dosage and power, which may depend on the tool being used and device requirements, should be conducted at parameters that are sufficient to amorphize the semiconductor substrate. Particularly, the power may be increased to a level sufficient to bring about the desired degree of amorphization without significantly changing the dopant concentrations from those associated with conventional collector implants.

With continued reference to FIG. 2, following the collector implant, whether subsequent to or concurrently with the amorphizing step, conventional processes may be used to complete the fabrication of the bipolar transistor. For example, a conventional base implant may used to form a base region 226 in the collector region 220. After the base region 226 is formed, the mask 224 is removed and a spacer oxide deposition may be conducted to form oxide spacers over gate electrodes when present in the non-bipolar regions of the semiconductor device 200. The oxide spacer deposition also results in an oxide layer 230 located over the bipolar region 210.

Figure 3:
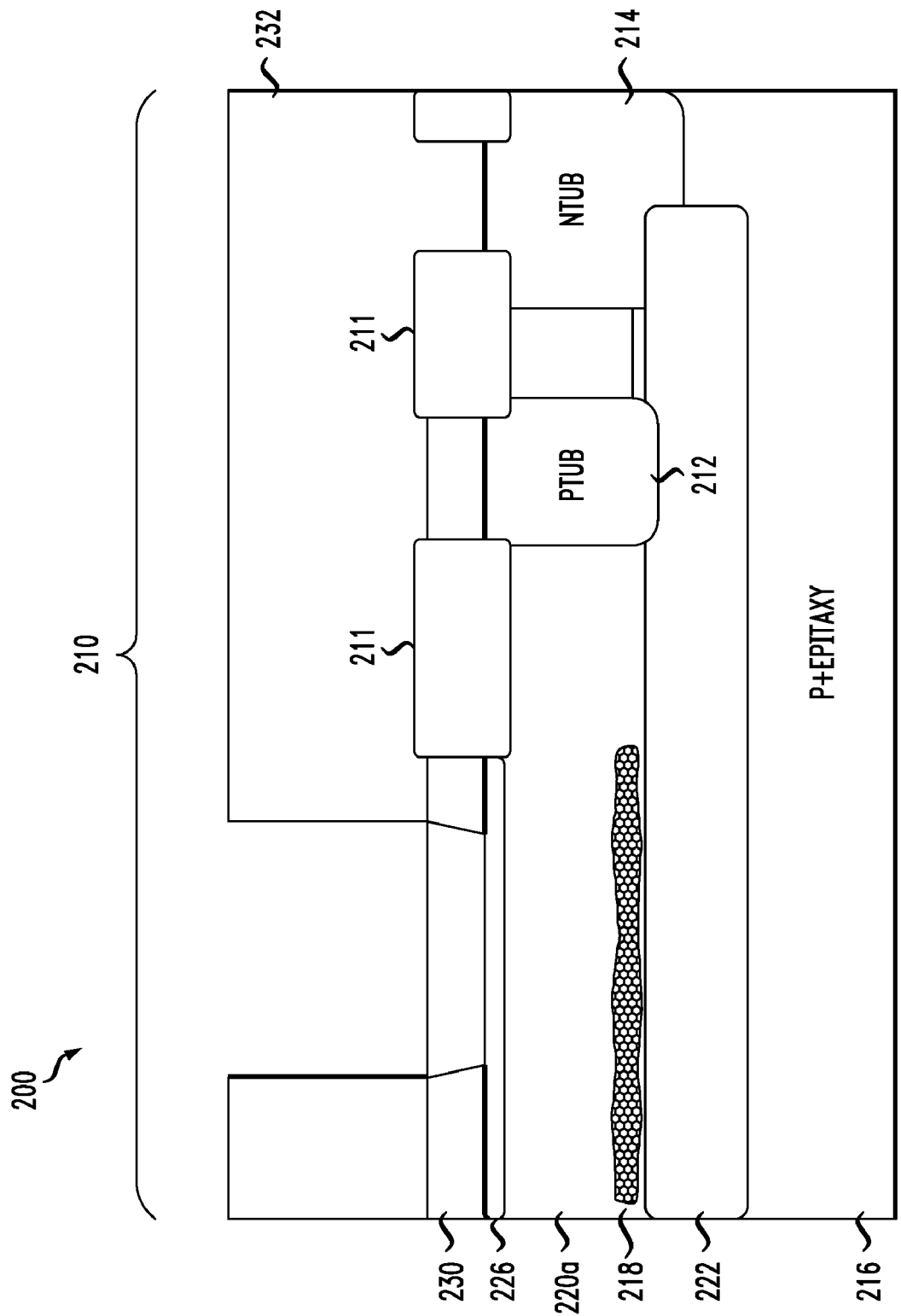
FIGS. 3-5 show the device of FIG. 2 during various subsequent stages of manufacture to the completion of a vertical bipolar transistor.

Following the oxide spacer deposition step, in FIG. 3, a mask 232 is deposited over the bipolar region 210 and non-bipolar region, when present, and an etch is conducted through the oxide layer 230 to expose the top surface of the semiconductor substrate 216 and the collector region 220, as shown.

Figure 4:
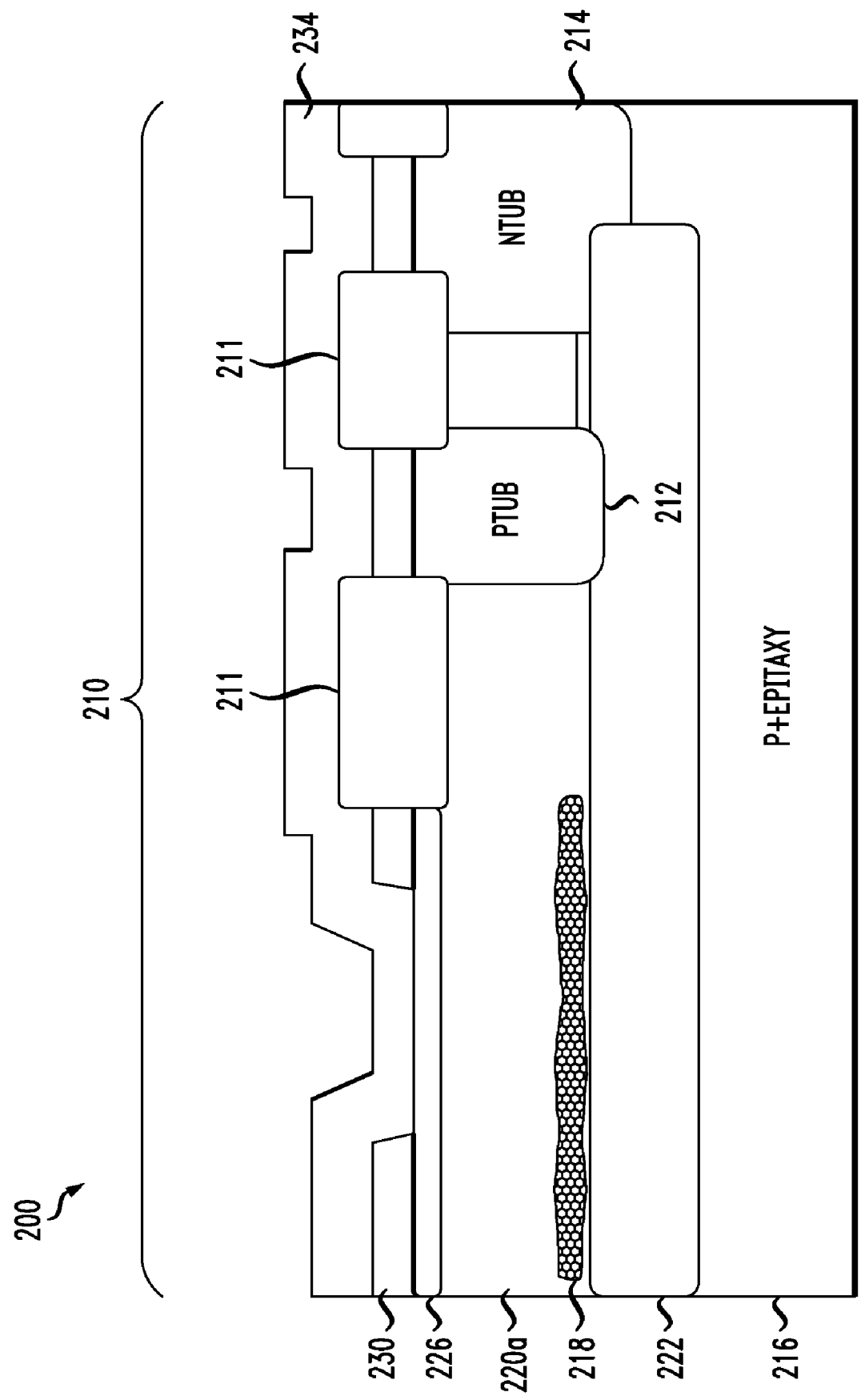
Figure 5:
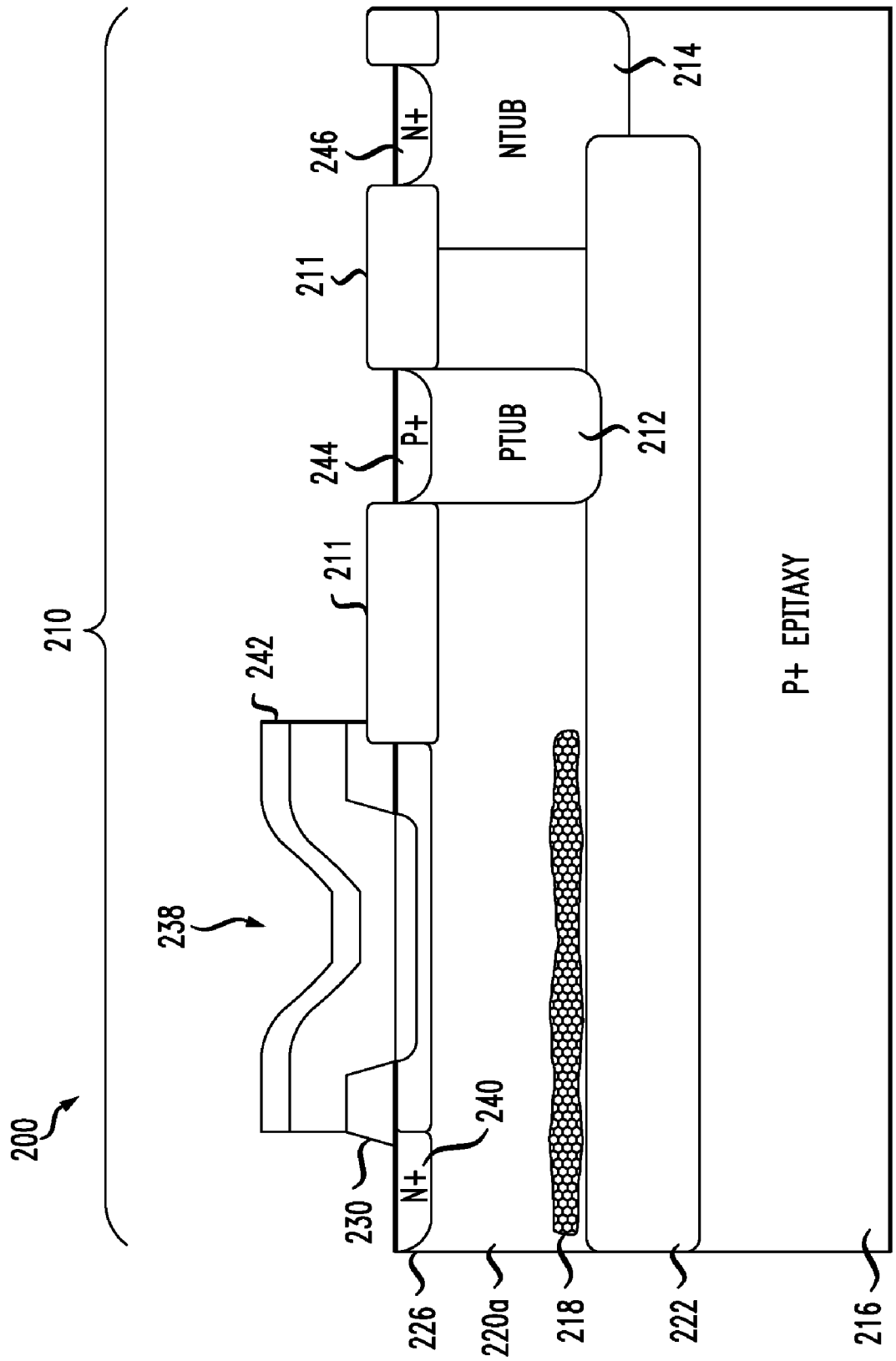

Mask 232 is removed and a base poly stack layer 234 is then formed, as shown in FIG. 4. Standard emitter deposition, emitter etch, and base poly etches may be conducted to arrive at the embodiment shown in FIG. 5. FIG. 5 illustrates a bipolar transistor 238 that includes a base contact 240, an emitter 242, a collector contact 244 and an isolation contact 246. It should be noted that the doping schemes may vary, depending on design, and those who are skilled in the art would understand how to implement such doping schemes to achieve an operable device. Other standard or conventional process may also be conducted subsequent to the emitter etch to complete the non-bipolar transistors when present and arrive at the device illustrated in FIG. 1.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
   forming an amorphous region at least partially in a collector region for a bipolar transistor;
   forming a collector in the collector region;
   forming a base over the collector region; and
   forming an emitter over the base.

2. The method recited in claim 1, wherein the amorphous region is formed by implanting a dopant having an atomic weight greater than boron.

3. The method recited in claim 2, wherein the dopant is silicon, germanium, argon, or neon.

4. The method recited in claim 2, wherein implanting includes implanting silicon at a power ranging from about 400 keV to about 1000 keV and at a dosage concentration ranging from about 5 E13 atoms/cm$^2$ to about 5 E15 atoms/cm$^2$.

5. The method recited in claim 1, wherein forming the amorphous region and forming the collector occur concurrently.

6. The method recited in claim 5, wherein forming the amorphous region and forming the collector comprises implanting boron, aluminum, gallium, or indium.

7. The method recited in claim 6, wherein implanting comprises implanting with boron wherein a wafer substrate temperature ranging from about 25° C. to about 50° C. and at a beam current ranging from about 1 mA to about 3 mA.

8. The method recited in claim 7, wherein implanting comprises implanting with boron at a dose ranging from about 8 E13 atoms/cm$^2$ to about 6 E14 atoms/cm$^2$ and at a power ranging from about 200 keV to about 500 keV.

9. The method recited in claim 6 wherein implanting comprises implanting with aluminum, gallium, or indium at a dose ranging from about 6 E13 atoms/cm$^2$ to about 6 E14 atoms/cm$^2$ and at a power ranging from about 500 keV to about 3000 keV.

10. A method of manufacturing an integrated circuit, comprising:
    forming non-bipolar transistors over a semiconductor substrate;
    forming bipolar transistors over the semiconductor substrate, including forming an amorphous region at least partially in a collector region of at least one bipolar transistor;

forming a collector in the collector region; forming a base over the collector region; and forming an emitter over the base;

forming dielectric layers over the non-bipolar transistors and bipolar transistors; and forming interconnects in the dielectric layers that electrically connect the non-bipolar and bipolar transistors.

11. The method recited in claim 10, wherein the amorphous region is formed by implanting a dopant having an atomic weight greater than boron.

12. The method recited in claim 11, wherein the dopant is silicon, germanium, argon, or neon.

13. The method recited in claim 11, wherein implanting includes implanting silicon at a power ranging from about 400 keV to about 1000 keV and at a dosage concentration ranging from about 5 E13 atoms/cm$^2$ to about 5 E15 atoms/cm$^2$.

14. The method recited in claim 10, wherein forming the amorphous region and conducting occur concurrently.

15. The method recited in claim 14, wherein forming the amorphous region and conducting comprises implanting boron, aluminum, gallium, or indium.

16. The method recited in claim 15, wherein implanting comprises implanting with boron wherein a wafer substrate temperature ranges from about 25° C. to about 50° C. and at a beam current ranges from about 1 mA to about 3 mA.

17. The method recited in claim 16, wherein implanting comprises implanting with boron at a dose ranging from about 8 E13 atoms/cm$^2$ to about 6 E14 atoms/cm$^2$ and at a power ranging from about 200 keV to about 500 keV.

18. The method recited in claim 15 wherein implanting comprises implanting with aluminum, gallium, or indium at a dose ranging from about 6E13 atoms/cm$^2$ to about 6E14 atoms/cm$^2$ and at a power ranging from about 500 keV to about 3000 keV.

19. A semiconductor device, comprising:
a bipolar transistor located over a semiconductor substrate;
a collector located within the semiconductor substrate and having an amorphous region formed at least partially therein;
a base located over the collector; and
an emitter located over the base.

20. The device recited in claim 19, wherein the amorphous region includes implanted silicon.

21. The device recited in claim 19, wherein the amorphous region includes aluminum, gallium, or indium.

22. The device recited in claim 19, wherein a thickness of the amorphous region ranges from about 0.03 microns to about 1 micron and a depth of the amorphous region ranges from about 0.02 microns to about 1.8 microns.

23. The device recited in claim 19, further comprising a plurality of bipolar transistors and non-bipolar transistors, dielectric layers located over the bipolar transistors and non-bipolar transistors; and interconnects formed within the dielectric layers that interconnect the bipolar transistors and non-bipolar transistors.

* * * * *